United States Patent
Tobe et al.

(10) Patent No.: US 8,337,621 B2
(45) Date of Patent: Dec. 25, 2012

(54) SUBSTRATE PROCESSING APPARATUS

(75) Inventors: Yasuhiro Tobe, Tokyo (JP); Satoru Kawakami, Amagasaki (JP); Shinji Matsubayashi, Amagasaki (JP)

(73) Assignee: Tokyo Electron Limited (JP)

( * ) Notice: Subject to any disclaimer, the term of this patent is extended or adjusted under 35 U.S.C. 154(b) by 880 days.

(21) Appl. No.: 12/516,498

(22) PCT Filed: Nov. 29, 2007

(86) PCT No.: PCT/JP2007/073035
§ 371 (c)(1),
(2), (4) Date: May 27, 2009

(87) PCT Pub. No.: WO2008/066013
PCT Pub. Date: May 6, 2008

(65) Prior Publication Data
US 2010/0043712 A1    Feb. 25, 2010

(30) Foreign Application Priority Data

Nov. 29, 2006  (JP) ................................. 2006-321672

(51) Int. Cl.
*B05C 13/02*   (2006.01)
*B05C 21/00*   (2006.01)
(52) U.S. Cl. ........................................ 118/729; 118/728
(58) Field of Classification Search .................. 118/728, 118/729
See application file for complete search history.

(56) References Cited

U.S. PATENT DOCUMENTS

| | | | | |
|---|---|---|---|---|
| 5,817,366 A | * | 10/1998 | Arai et al. ..................... | 118/719 |
| 2002/0070699 A1 | * | 6/2002 | Tanaka et al. ................. | 318/687 |

FOREIGN PATENT DOCUMENTS

| | | |
|---|---|---|
| JP | 04-065853 | 3/1992 |
| JP | 04-251026 | 9/1992 |
| JP | 05-48502 | 6/1993 |
| JP | 07-109024 | 4/1995 |
| JP | 2002-082445 | 3/2002 |
| JP | 2003-209962 | 7/2003 |
| JP | 2004-079904 | 3/2004 |
| JP | 2005-307353 | 11/2005 |

OTHER PUBLICATIONS

Japanese Office Action—Japanese Application No. 2008-547025 issued on Aug. 9, 2011, citing JP 2002-082445, JP 2003-209962, JP 2005-307353, JP 03-098360, JP 04-065853, JP 07-109024, and JP 04-251026.
Korean Office Action—Korean Application No. 10-2009-7005532 issued on Nov. 28, 2011, citing JP 2002-082445, JP 2003-209962, and JP 2005-307353.

(Continued)

Primary Examiner — Dah-Wei Yuan
Assistant Examiner — Stephen Kitt
(74) Attorney, Agent, or Firm — Cantor Colburn LLP

(57) ABSTRACT

A processing apparatus for processing a substrate G includes a processing chamber for processing the substrate; a depressurizing mechanism reducing an internal pressure of the processing chamber; and a transfer mechanism disposed in the processing chamber to transfer the substrate, wherein the transfer mechanism includes: a guide member; a stage for holding the substrate; a driving member for moving the stage; and a movable member supporting the stage and moving along the guide member. The guide member and the movable member are maintained so as not to contact each other by a repulsive force of magnets.

11 Claims, 10 Drawing Sheets

OTHER PUBLICATIONS

International Search Report—PCT/JP2007/073035 dated Jan. 29, 2008.

International Preliminary Report on Patentability—PCT/JP2007/073035 dated Oct. 31, 2008.

Notice of Preliminary Rejection issued by Korean Intellectual Property Office on Mar. 10, 2011, citing JP2002-082445, JP2003-209962 and JP2005-307353.

* cited by examiner

SUBSTRATE PROCESSING APPARATUS

TECHNICAL FIELD

The present invention relates to an apparatus for processing a substrate, for example, for forming layers on a substrate in a processing chamber under reduced pressure

BACKGROUND ART

Organic electroluminescence (EL) devices have been recently developed. Organic EL devices generate almost no heat, and thus a power consumption thereof is lower than that of cathode ray tubes. In addition, since the organic EL devices are self-emissive devices, they have advantages, such as a wider viewing angle and the like, compared to liquid crystal displays (LCDs), and thus, future growth of the organic EL devices is being expected.

A conventional organic EL device basically has a sandwich structure in which an anode layer, a light emitting layer, and a cathode layer are stacked on a glass substrate. In order to bring out light from the light emitting layer to outside, a transparent electrode formed of indium tin oxide (ITO) is used as the anode layer on the glass substrate. The conventional organic EL device is generally fabricated by forming the light emitting layer and the cathode layer sequentially on the ITO layer (the anode layer) which is formed in advance on the glass substrate.

An apparatus for forming a light emitting layer of such an organic EL device is disclosed in Japanese Patent Laid-open Publication No. 2004-79904 (hereinafter, referred to as reference 1).

In a process of forming the light emitting layer of the organic EL device, a pressure in a processing chamber is reduced to a predetermined level. Because, when the light emitting layer of the organic EL device is formed as above, a vaporized layer forming material at a high temperature of about 200° C. to 500° C. is supplied from a deposition head to be deposited on a surface of a substrate and the heat of the vaporized layer forming material may increase temperatures of components such as various sensors disposed in the processing chamber due to air convection in the processing chamber, thereby degrading characteristics of the components or damaging the components, if the light emitting layer is deposited in an atmosphere. Therefore, when the light emitting layer of the organic EL device is formed, an internal pressure in the processing chamber is reduced to a predetermined level so that the heat of the vaporized material does not propagate to other components (vacuum heat insulation).

However, since a substrate transfer mechanism is placed in the processing chamber, a contaminant may be generated from the transfer mechanism and negatively affects the layer forming operation, when the internal pressure in the processing chamber is reduced. More specifically, the transfer mechanism generally includes a linear guide for guiding a stage which supports the substrate along a linear path, a driving motor for moving the stage, and a metal roller. Thus, when the internal pressure of the processing chamber is reduced, grease used as a lubricant in the linear guide may vaporize, and then, the vaporized grease may be mixed as a contaminant into the light emitting layer of the organic EL device.

Also, in this case, since the linear guide moves without the grease, particles are generated due to friction in the linear guide, and thus, the processing chamber cannot be maintained clean. Recently, a thin film formed of $MoS_2$ and so on as a solid lubricant, has been deposited on a surface of a metal ball using a sputtering method to ensure lubrication, and thus omission of grease has been attempted. However, even in this case, particles may be generated in the processing chamber, and moreover, the solid lubricant does not have a long lifespan, and thus, it is difficult to maintain properties of the solid lubricant.

In another case, the linear guide that may cause a contamination of the processing chamber may be accommodated in a bellows or the like, however, it is difficult to dispose the bellows in the processing chamber of which internal pressure is reduced, and the bellows may make the overall structure of the processing chamber complex. Therefore, increase of fabrication costs and an enlargement of an installation space may occur. In addition, byproducts attached to the bellows may drop in the processing chamber due to the contraction of the bellows, thereby staining the processing chamber. In addition, since a vacuum bellows has a large surface area, a desired degree of vacuum cannot accomplish due to a discharged gas from the surface of the bellows.

Therefore, the present invention provides a mechanism for transferring the substrate without causing contamination by using a simple structure in the processing chamber of which internal pressure is reduced.

DISCLOSURE OF THE INVENTION

To solve the above and/or other problems, the present invention provides a processing apparatus for processing a substrate, the processing apparatus including: a processing chamber for processing the substrate; a depressurizing mechanism reducing an internal pressure of the processing chamber; and a transfer mechanism disposed in the processing chamber to convey the substrate, wherein the transfer mechanism may include: a guide member; a stage for holding the substrate; a driving member for moving the stage; and a movable member supporting the stage and moving along the guide member, wherein the guide member and the movable member are maintained so as not to contact each other by a repulsive force of magnets, and wherein a space which is isolated from an inner atmosphere of the processing chamber may be formed in the stage, and a duct member is used for communication of the space with the outer atmosphere of the processing chamber.

According to the processing apparatus of the present invention, when the stage is moved by the driving member, the movable member moving with the stage does not contact the guide member due to the repulsive force of the magnets. Therefore, there is no friction between the guide member and the movable member. Accordingly, the stage may move smoothly without using grease.

The processing apparatus may further include a cooling mechanism for cooling the magnets. The stage may include an electrostatic chuck holding the substrate, and a line for supplying an electric power to the electrostatic chuck may be disposed in the duct member. The driving member may be a motor, and a line for supplying an electric power to the motor may be disposed in the duct member. The motor may be a shaft motor. The stage may include heat transfer medium paths for adjusting a temperature of the substrate, and a pipe for supplying a heat transfer medium to the heat transfer medium paths may be disposed in the duct member. The stage may include a heat transfer gas supplying unit which supplies a heat transfer gas between the substrate and the stage, and a pipe for supplying the heat transfer gas to the heat transferring gas supplying unit may be disposed in the duct member.

The space may be maintained at an atmospheric pressure. The duct member may be formed of a multi-joint arm.

The processing apparatus may further include a deposition head supplying a vaporized layer forming material onto the substrate held by the stage. The layer forming material may be a material used to form a light emitting layer in an organic electroluminescence (EL) device.

BEST MODE FOR CARRYING OUT THE INVENTION

Figure 1:
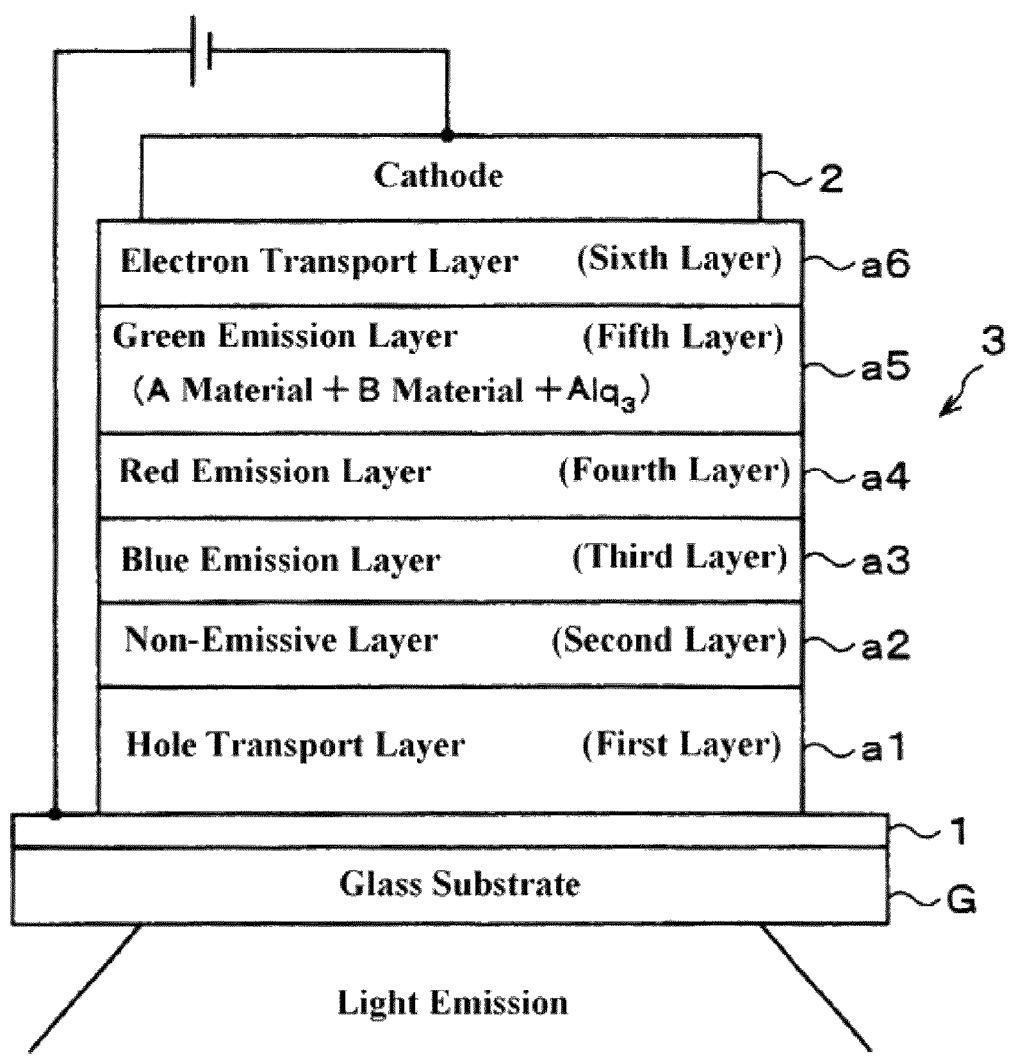
FIG. 1 is a view illustrating an organic electroluminescent (EL) device.

Hereinafter, the present invention will be described in detail by explaining exemplary embodiments of the invention with reference to the attached drawings. In the embodiments of the present invention, a processing system 10 for fabricating an organic electroluminescence (EL) device by depositing an anode 1, a light emitting layer 3, and a cathode 2 on a glass substrate G will be described as an example. Like reference numerals in the drawings denote like elements, and thus their description will not be provided.

FIG. 1 is a view illustrating the organic EL device according to an embodiment of the present invention. The organic EL device has a basic sandwich structure in which a light emitting layer 3 is interposed between an anode 1 and a cathode 2. The anode 1 is formed on the glass substrate G. The anode 1 may be a transparent electrode which may transmit light emitted from the light emitting layer 3, for example, a transparent electrode formed of indium tin oxide (ITO).

The light emitting layer 3, that is, an organic layer, may have a single layered structure or a multi-layered structure. FIG. 1 shows a six-layered structure including a first layer a1 to a sixth layer a6. The first layer a1 is a hole transport layer, a second layer a2 is a non-emissive layer (electron blocking layer), a third layer a3 is a blue emission layer, a fourth layer a4 is a red emission layer, a fifth layer a5 is a green emission layer, and the sixth layer a6 is an electron transport layer. The organic EL device is fabricated, as will be described later, by sequentially depositing the light emitting layer 3 (the first layer a1 to the sixth layer a6) on the anode 1 on the glass substrate G, disposing a work function adjusting layer (not shown), forming the cathode 2 such as Ag or Ma/Ag alloy, and sealing the entire layers using a nitride layer (not shown).

Figure 2:
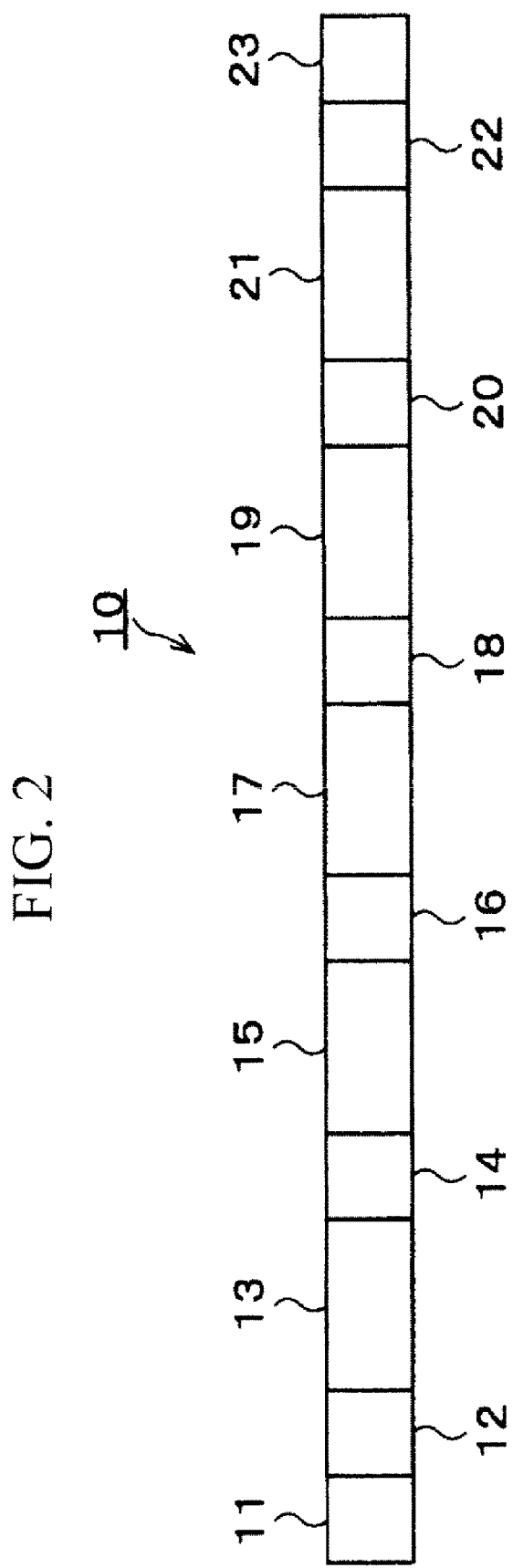
FIG. 2 is a view illustrating a layer forming system.

FIG. 2 is a view illustrating a layer forming system 10, namely, the processing system 10, for fabricating the organic EL device. The layer forming system 10 includes a loader 11, a transfer chamber 12, an evaporation processing device 13 for the light emitting layer 3, a transfer chamber 14, a work function adjusting layer forming device 15, a transfer chamber 16, an etching device 17, a transfer chamber 18, a sputtering device 19, a transfer chamber 20, a chemical vapor deposition (CVD) device 21, a transfer chamber 22, and an unloader 23 arranged in series along a transfer direction (toward a right side of FIG. 2) of the substrate G. The loader 11 is a device for carrying the substrate G into the layer forming system 10. The transfer chambers 12, 14, 16, 18, 20, and 22 are devices for receiving and transferring the substrate G between each of the processing devices. The unloader 23 is a device for carrying the substrate G out of the layer forming system 10.

Figure 3:
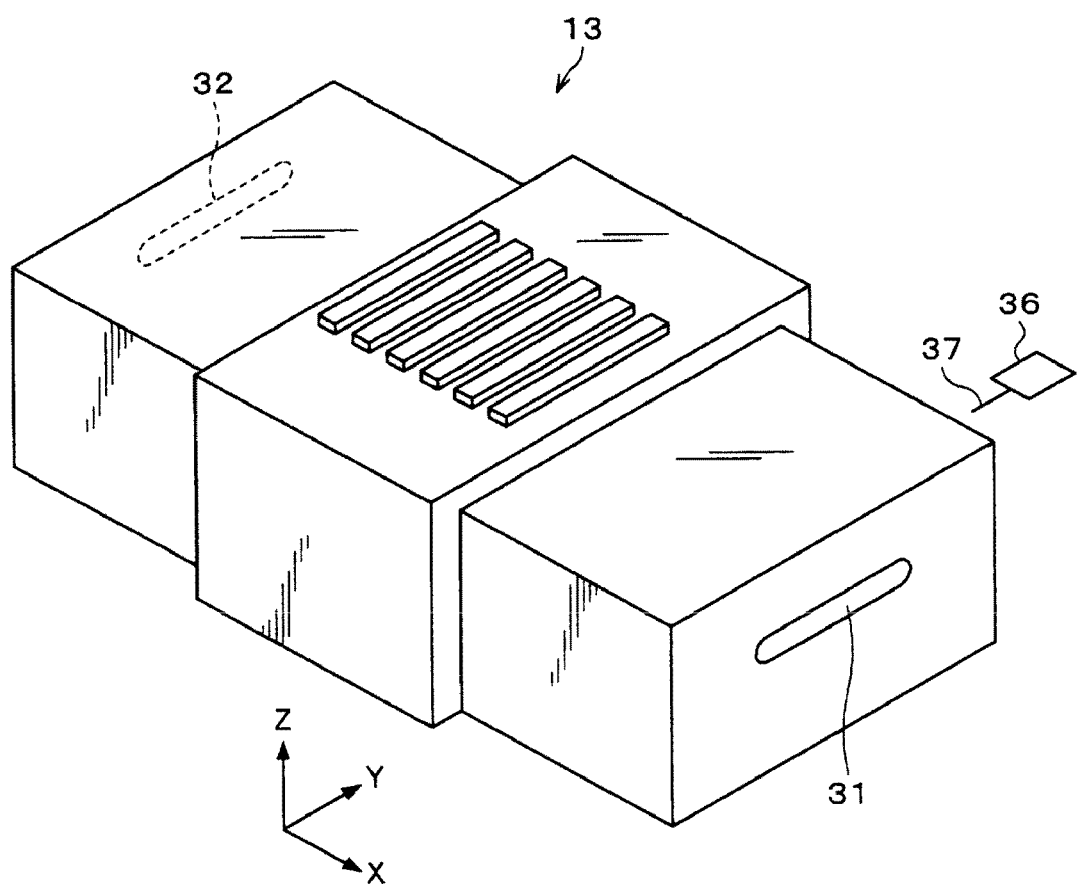
FIG. 3 is a perspective view of a deposition processing apparatus according to an embodiment of the present invention.
Figure 4:
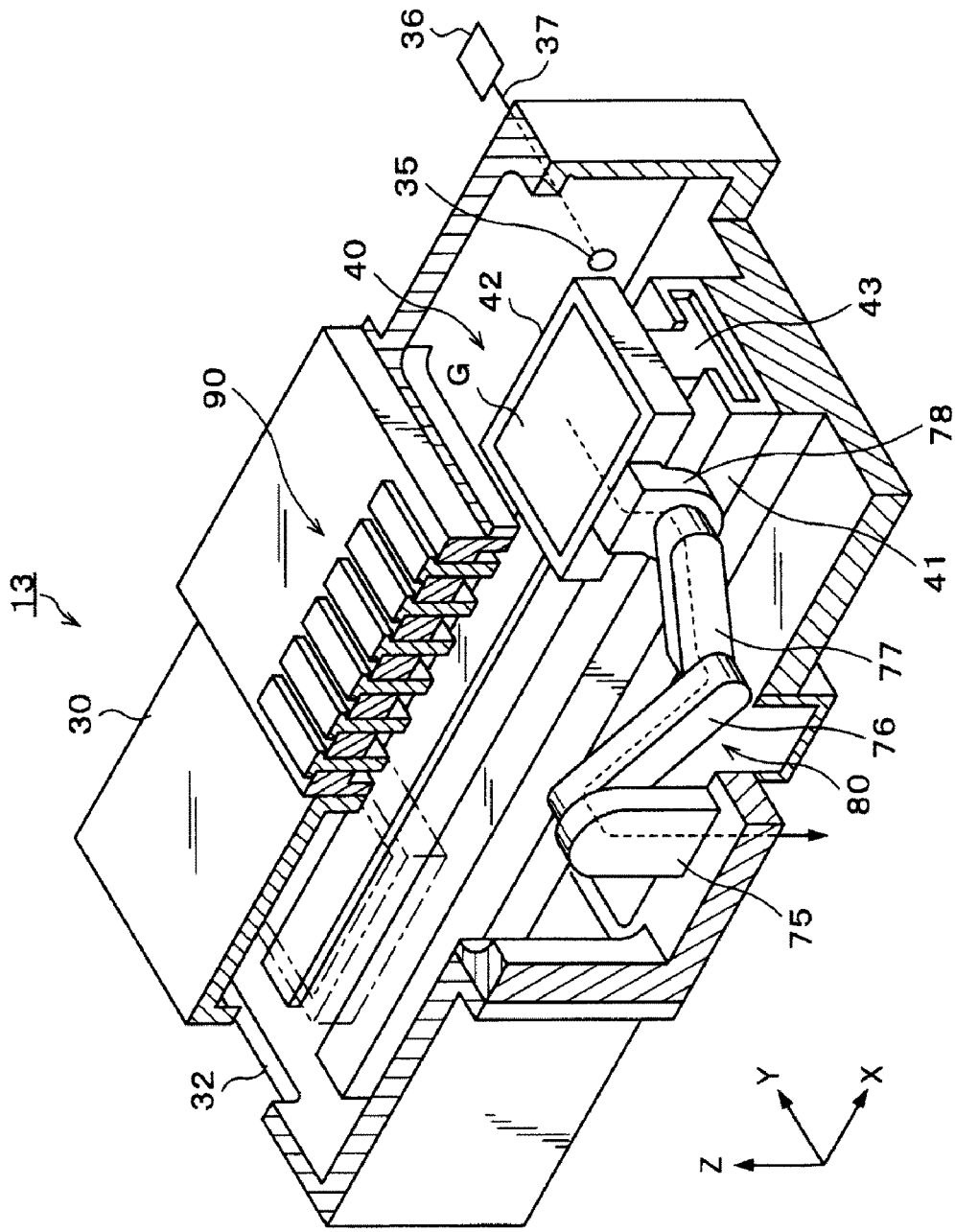
FIG. 4 is a partial cross-sectional view of an internal structure in the deposition processing apparatus illustrated in FIG. 3.

Here, the evaporation processing device 13 of the present embodiment will be described in more detail. FIG. 3 is a perspective view of the evaporation processing device 13, and FIG. 4 is a partial cross-sectional view illustrating an internal structure of the evaporation processing device 13.

The evaporation processing device 13 includes a processing chamber 30 for performing a evaporation process on the substrate G therein. The processing chamber 30 is formed of aluminium or stainless steel and is fabricated using a cutting process or a welding process. The processing chamber 30 is formed as a rectangular parallelepiped. An outlet 31 is provided on a front surface of the processing chamber 30, and an inlet 32 is provided on a rear surface of the processing chamber 30. In the evaporation processing device 13, the substrate G inserted through the inlet 32 of the processing chamber 30 is transferred toward the front portion in the processing chamber 30, and then, is carried out through the outlet 31 in the front surface of the processing chamber 30. For convenience sake, the direction of transferring the substrate G is defined as an X-axis, a direction crossing the X-axis at a right angle on a plane is defined as a Y-axis, and a direction perpendicular to the X-axis is defined as a Z-axis.

An exhaust hole 35 is formed in a side surface of the processing chamber 30, and a vacuum pump 36, a depressurizing mechanism disposed outside of the processing chamber 30, is connected to the exhaust hole 35 via an exhaust pipe 37. When the vacuum pump 36 operates, the inner space of the processing chamber 30 is depressurized down to a predetermined pressure.

In the processing chamber 30, a transfer mechanism 40 for transferring the substrate G along the X-axis direction is installed. The transfer mechanism 40 includes a guide member 41, which extends in the X-axis direction on a bottom of the processing chamber 30, and a stage 42 holding the substrate G. In addition, a movable member 43 movable along the guide member 41 in the X-axis direction is provided, and the stage 42 is supported on the movable member 43.

Figure 5:
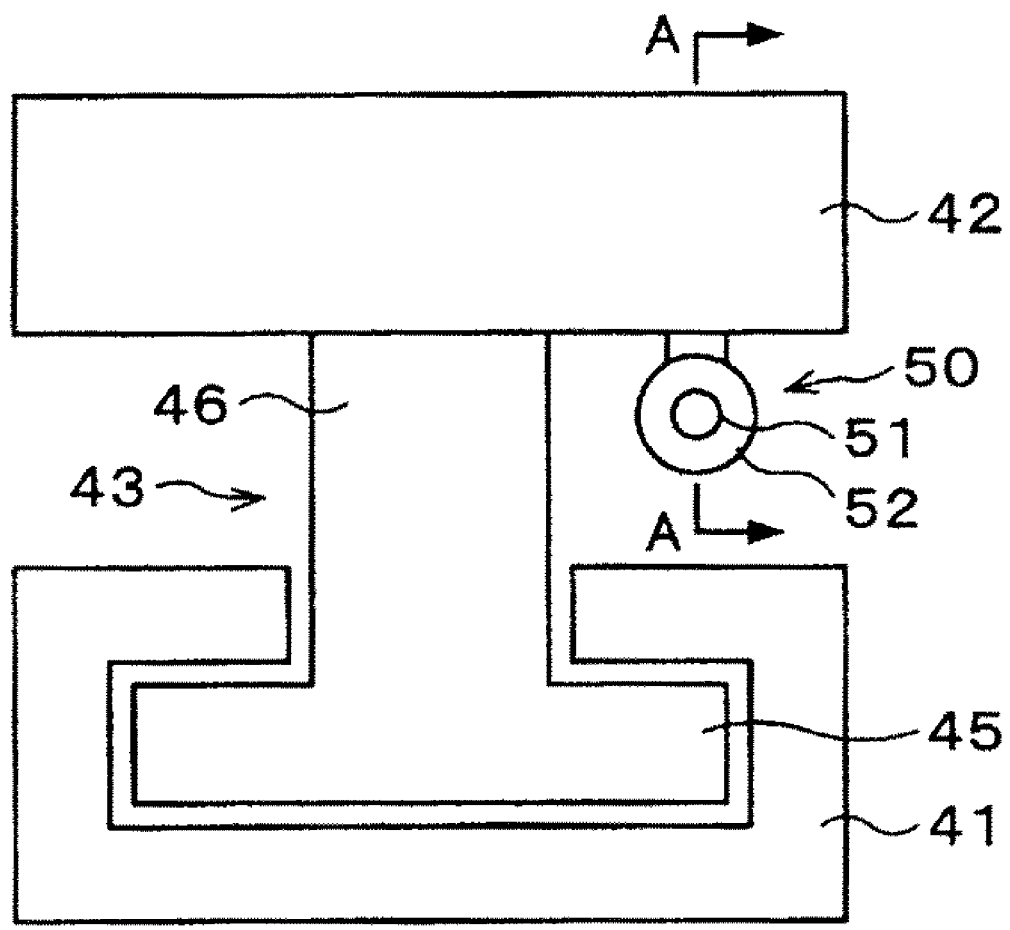
FIG. 5 is a front view of a transfer mechanism.

Referring to FIG. 5, the movable member 43 has an inverse T shape in which a vertical portion 46 is formed perpendicularly to an upper center surface of a horizontal portion 45. The stage 42 is supported on an upper end portion of the vertical portion 46. In addition, the horizontal portion 45 of the movable member 43 is held in a recess formed in the guide member 41.

Figure 6:
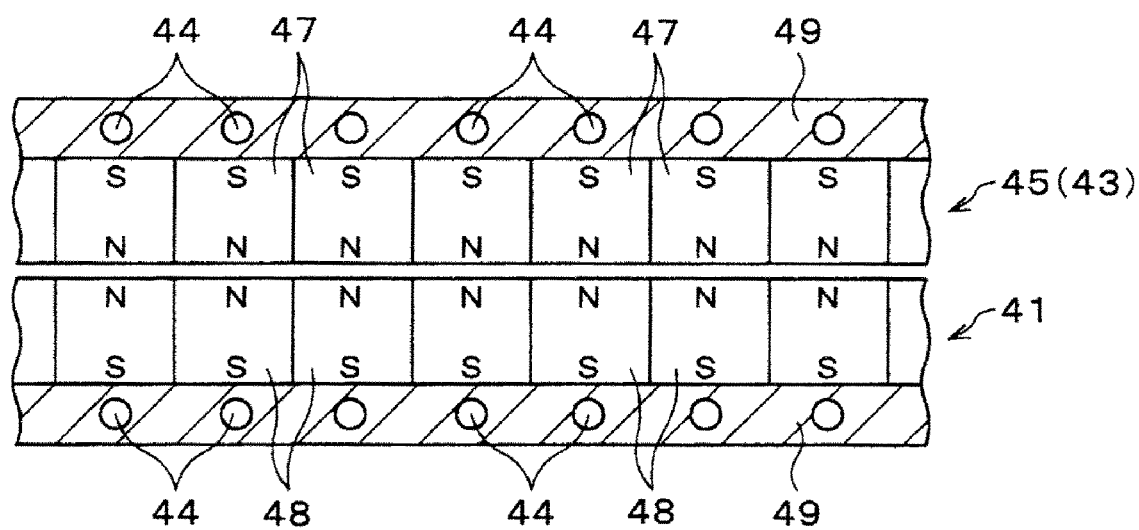
FIG. 6 is a view illustrating original shapes of a magnet formed on a moving member and a magnet formed on a guide member.

As shown in FIG. 6, magnets 47 and 48 are disposed to face each other on an outer surface of the horizontal portion 45 of the movable member 43 and on an inner surface of the recess in the guide member 41. In this case, the magnets 47 placed on the horizontal portion 45 of the movable member 43 and the magnets 48 placed in the guide member 41 are disposed such that the same polarities thereof face each other. For example, when the magnets 47 disposed on the horizontal portion 45 of the movable member 43 are arranged such that S-poles face to the outside, the magnets 48 disposed in the guide member 41 are disposed such that S-poles thereof face the S-poles of the magnets 47. On the other hand, when the magnets 47 disposed on the horizontal portion 45 of the movable member 43 are arranged such that the N-poles face to the outside, the magnets 48 disposed in the guide member 41 are disposed such that the N-poles thereof face the N-poles of the magnets 47. Therefore, a repulsive force is generated between the outer surface of the horizontal portion 45 of the movable member 43 and the inner surface of the guide member 41 due to the magnets 47 and 48 disposed on the horizontal portion 45 of the movable member 43 and in the guide member 41 so as not to contact each other.

In addition, the magnets 47 placed on the horizontal portion 45 of the movable member 43 and the magnets 48 placed in the guide member 41 are permanent magnets. Therefore, complex control such as control performed in a magnetic levitation device using electromagnets, or various sensors (gap sensors, acceleration sensors, etc.) for performing the control operations are not required, and moreover, a touch-down caused by power outage cannot occur. In addition, since electromagnets are not used, electric power can be saved. Magnetic bodies 49, generally referred to as back yokes, are disposed on back portions of the magnets 47 and 48 disposed on the horizontal portion 45 and in the guide member 41, respectively. Since the magnetic bodies (back yokes) 49 surround the magnets 47 and 48, the repulsive force for magnetic levitation increases and leakage of a magnetic field is prevented.

A refrigerant path 44 for flow of a refrigerant is formed in the magnetic body 49. The refrigerant path 44 performs as a cooling mechanism for cooling down the magnets 47 placed on the horizontal portion 45 of the movable member 43 and the magnets 48 placed in the guide member 41. The refrigerant flowing through the refrigerant path 44 may be a fluoride-based heat transfer medium (for example, Galden). Generally, a magnetic force of a permanent magnet may degrade when a temperature rises. The magnets 47 and 48 may be exposed to high temperature heat due to heat input from a deposition head 90, which will be described later. When the temperature of the magnets 47 and 48 rises too high, the repulsive force may be reduced a lot, and thus, the magnets 47 and 48 may contact each other. Therefore, the refrigerant flows through the refrigerant path 44 to prevent the temperature of the magnets 47 and 48 from rising. In addition, as shown in FIG. 6, when the refrigerant path 44 is formed in the magnetic body 49, contact surfaces between the magnets 47 and 48 and the magnetic body 49 may be processed with high accuracy so as to prevent a gap from being formed between the magnets 47 and 48 and the magnetic body 49, in order to transfer cool of the refrigerant from the magnetic body 49 to the magnets 47 and 48 effectively. In this case, a flatness (Ra) of the contact surfaces between the magnets 47 and 48 and the magnetic body 49 may be set in a range of about 0.2~6.3. In addition, the temperature of the refrigerant flowing through the refrigerant path 44 may be set in a range of, for example, 10°~60° C., and the temperature of the magnets 47 and 48 may be in a range of, for example, 15°C.~80° C.

A gap between the outer surface of the horizontal portion 45 of the movable member 43 and the inner surface of the guide member 41 may be about 10 μm to 5 mm, and the permanent magnets, namely the magnets 47 and 48, the repulsive force is generated therebetween are disposed so that the surface of the horizontal portion 45 and the inner surface of the guide member 41 do not contact each other during movement of the movable member 43. In addition, in order to prevent the surface of the horizontal portion 45 of the movable member 43 and the inner surface of the guide member 41 from contacting each other, a contact sensor may be installed. Also, gaps between the magnets 47 and 48 are made to be constant as much as possible, and thus, a variation of the repulsive force between the magnets 47 and 48 is prevented, and, a stable guide operation may be realized due to the stable magnetic levitation.

In addition, since the magnets 47 and 48 are installed in a vacuum state in the processing chamber 30, the magnets 47 and 48 may be exposed to a corrosive gas or a cleaning gas. Therefore, the magnets 47 and 48 should be sealed by a non-magnetic material having high durability with respect to the corrosive gas or the cleaning gas, or surface treatments of the magnets 47 and 48 should be performed.

A shaft motor 50, a driving member for moving the stage 42 in the X-axis direction, is installed in the processing chamber 30. The shaft motor 50 is a direct-drive (linear) motor including a shaft 51 formed as a cylinder arranged in the X-axis direction and a coil case 52 having a cylindrical shape and formed of a non-magnetic material so as to freely move around the shaft 51. The coil case 52 includes an electromagnetic coil 53 disposed to surround the shaft 51. The shaft 51 is formed by arranging electromagnets so that N-poles and S-poles thereof alternate along the X-axis. The shaft motor 50 having the above-described structure may transport the stage 42 at a stable velocity in the X-axis direction when an electric current is supplied to the electromagnetic coil 53. In this case, a surface of the shaft 51 and an inner surface of the coil case 52 do not contact each other, and thus there is no friction therebetween. A movable element for a shaft motor manufactured by GMC Hillstone, Co., Ltd. May be used in the shaft motor 50.

Figure 7:
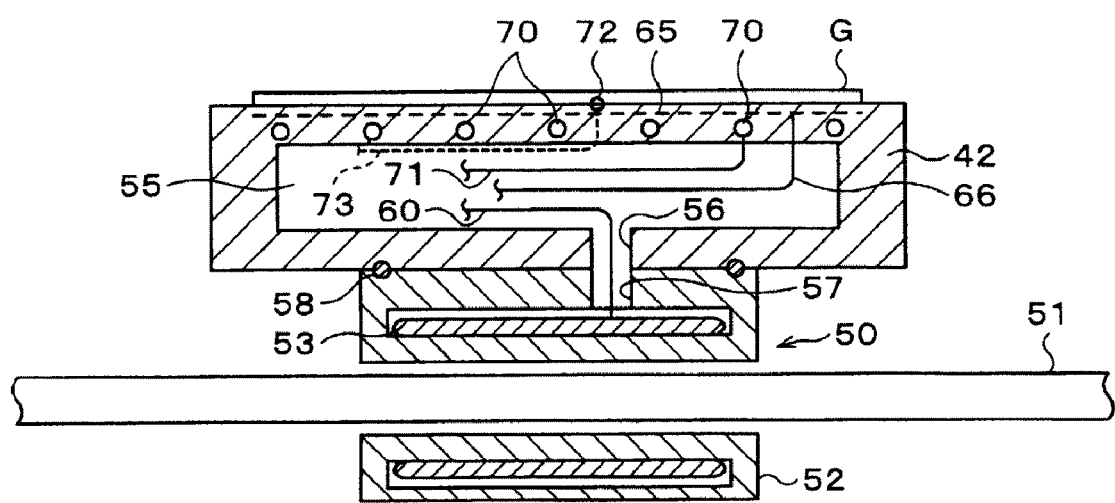
FIG. 7 is an expanded view of a cross-section of the transfer mechanism taken along line A-A in FIG. 5.

Referring to FIG. 7, the stage 42 includes a space 55 isolated from the internal environment of the processing chamber 30. The space 55 and an internal space including the electromagnetic coil 53 placed in the coil case 52 of the shaft motor 50 are communicated to each other via a hole 56 formed in a lower surface of the stage 42 and a hole 57 formed in an upper surface of the coil case 52. In addition, seals 58, that is, O-rings, are disposed between the lower surface of the stage 42 and the upper surface of the coil case 52 so that the space 55 in the stage 42 and the internal space of the coil case 52 may be isolated from the internal environment of the processing chamber 30.

A power supplying line 60 for supplying power to the electromagnetic coil 53 is extended to the space 55 in the stage 42 via the hole 57 formed in the upper surface of the coil case 52 and the hole 56 formed in the lower surface of the stage 42.

An electrostatic chuck 65 is placed inside the upper surface of the stage 42 for holding the substrate G on the stage 42. A power supplying line 66 for supplying power to the electrostatic chuck 65 is extended to the space 55 in the stage 42.

In addition, heat transfer medium paths 70 for adjusting a temperature of the substrate G on the stage 42 are formed inside the upper surface of the stage 42. A pipe 71 for supplying a heat transfer medium, for example, ethylene glycol, to the heat transfer medium paths 70 is also extended to the space 55 in the stage 42. In addition, a heat transfer gas supplying unit 72 is disposed on the upper surface of the stage 42 in order to supply a heat transfer gas to a gap between the lower surface of the substrate G held on the stage 42 and the upper surface of the stage 42. A gas supplying pipe 73 which supplies the heat transfer gas, for example, He, to the heat transfer gas supplying unit 72 is also extended to the space 55 in the stage 42.

As shown in FIG. 4, a duct member 80 having a multi-joint arm structure including a processing chamber pillar 75, two arms 76 and 77, and a stage pillar 78 is connected to the stage 42. All of the processing chamber pillar 75, the arms 76 and 77, and the stage pillar 78 have hollow inner spaces so that the space 55 in the stage 42 and an outer atmosphere of the processing chamber 30 may be communicated to each other via the inner spaces of the duct member 80 including the processing chamber pillar 75, the arms 76 and 77, and the stage pillar 78. In addition, although it is not shown in the drawings, a hole communicating with the inner space of the processing chamber pillar 75 is formed in a bottom surface of the processing chamber 30. Likewise, a hole communicating with the inner space of the stage pillar 78 is formed in a side surface of the stage 42.

The power supplying line 60 for supplying power to the electromagnetic coil 53, the power supplying line 66 for supplying power to the electrostatic chuck 65, the pipe 71 for supplying the heat transfer medium to the heat transfer medium path 70, and the gas supplying pipe 73 supplying the heat transfer gas to the heat transfer gas supplying unit 72 extended to the space 55 in the stage 42 are extended out of the processing chamber 30 via the inner space of the duct member 80.

Figure 8:
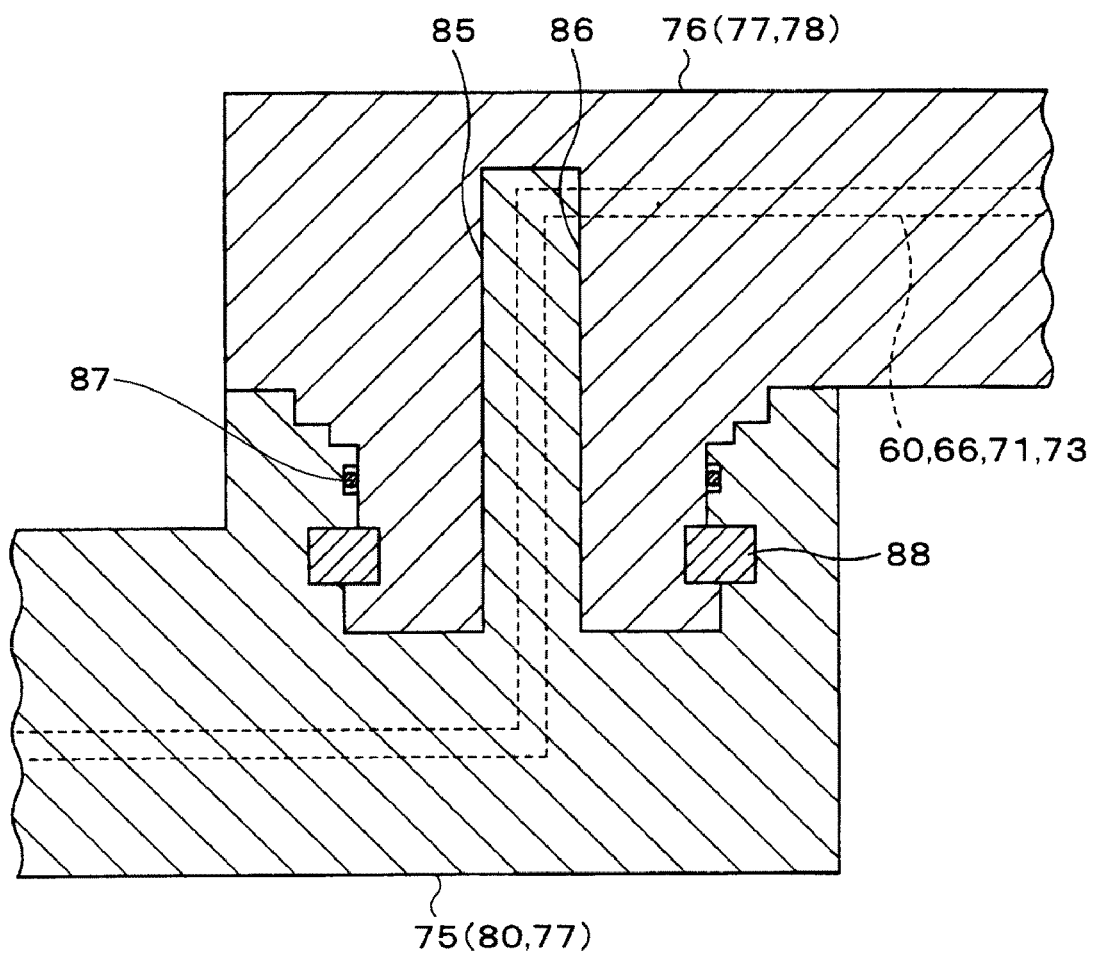
FIG. 8 is a cross-sectional view illustrating an indirect portion of a duct member.

In the duct member 80, the processing chamber pillar 75 is installed perpendicularly to the bottom surface of the processing chamber 30, and an end portion of the arm 76 is connected to the processing chamber pillar 75. As shown in FIG. 8, the end portion of the arm 76 is connected to the processing chamber pillar 75 by inserting a cylindrical projection portion 85 which is arranged on the processing chamber pillar 75 in the Y-axis direction into a cylindrical depressed portion 86 which is arranged in the end portion of the arm 76 in the Y-axis direction. In addition, the arm 76 may rotate around the cylindrical projection portion 85. Ring-shaped bearings (cross-roller bearings) 88 for rotating the arm 76 smoothly and seals 87, that is, O-rings, for sealing the processing chamber pillar 75 and the arm 76 are mounted on an outer circumferential surface of the cylindrical depressed portion 86. In addition, a connection between the other end of the arm 76 and an end of the arm 77 and a connection between the other end of the arm 77 and the stage pillar 78 are realized in the same way as the connection between the processing chamber pillar 75 and an end of the arm 76, and repeated descriptions are not provided. Accordingly, the space 55 in the stage 42 is in communication with the outside of the processing chamber 30 through the duct member 80, while the space 55 in the stage 42 is maintained to be isolated with the internal environment of the processing chamber 30. In addition, the connection between the processing chamber pillar 75 and an end of the arm 76, the connection between the other end of the arm 76 and an end of the arm 77, and the connection between the other end of the arm 77 and the stage pillar 78 may be realized using a rotary joint (liquid) or a rotary connector (electricity). Also, the seals 87, that is, the O-rings, may be replaced with a magnetic liquid seal.

In addition, since the connections between the processing chamber pillar 75, the arms 76 and 77, and the stage pillar 78 which constitute the duct member 80 are realized through the cylindrical projection portion 85 and the cylindrical depressed portion 86 which are arranged in the Y-axis direction, the two arms 76 and 77 freely rotate in a plane perpendicular to the Y-axis direction (X-Z plane). Therefore, when the stage 42 moves along the guide member 41 in the X-axis direction, the two arms 76 and 77 appropriately rotate in the plane perpendicular to the Y-axis (X-Z plane) so as to maintain the communication between the space 55 in the stage 42 and the outside of the processing chamber 30.

In addition, since the duct member 80 is connected to the stage 42, postures of the stage 42 are restricted by the duct member 80. That is, when the connections between the processing chamber pillar 75, the arms 76 and 77, and the stage pillar 78 are realized using the cylindrical projection portion 85 and the cylindrical depressed portion 86 which are arranged in the Y-axis direction as described above, a movement of the stage 42 in the Y-axis direction (a transversal deviation), a rotation of the stage 42 around the X-axis (rolling), and a rotation of the stage 42 around the Z-axis (yawing) are restricted. Accordingly, it is easy to maintain the correct posture of the stage 42. Also, when the axial directions of the cylindrical projection portion 85 and the cylindrical depressed portion 86 are changed, a combination of the stage movements which are restricted (for example, movement in the X, Y, of Z-axis direction, rolling, yawing, and pitching) may be freely arranged.

The deposition head 90 which supplies a vaporized layer forming material to the surface of the substrate G that moves while being held by the stage 42 is disposed on the upper surface of the processing chamber 30. In the deposition head 90, a first head for forming the hole transport layer, a second head for forming the non-emissive layer, a third head for forming the blue emission layer, a fourth head for forming the red emission layer, a fifth head for forming the green emission layer, and a sixth head for forming the electron transport layer are arranged in the direction in which the stage 42 moves (X-axis direction).

Next, the work function adjusting layer forming device 15 illustrated in FIG. 2 forms the work function adjusting layer on the surface of the substrate G by an evaporation. The etching device 17 etches the formed layers. The sputtering device 19 forms the cathode 2 by sputtering an electrode material such as Ag. The CVD device 21 forms a sealing layer of, for example, a nitride layer, using the CVD operation to seal the organic EL device.

In the layer forming system 10 having the above-described structure, first, the substrate G carried through the loader 11 is transferred into the evaporation processing device 13 via the transfer chamber 12. The anode 1 of ITO is formed on the surface of the substrate G as a predetermined pattern in advance.

Then, in the evaporation processing device 13, the substrate G is mounted on the stage 42 so that a surface on which layers will be formed faces upward. Before the substrate G is carried into the evaporation processing device 13, the inside of the processing chamber 30 of the evaporation processing device 13 is depressurized down to a predetermined pressure by the vacuum pump 36.

After that, the stage 42 moves along the guide member 41 in the X-axis direction in the depressurized processing chamber 30 of the evaporation processing device 13, and while the stage 42 is moving, the vaporized layer forming material is supplied from the deposition head 90 to gradually form the light emitting layer 3 on the surface of the substrate G.

Next, the substrate G on which the light emitting layer 3 is formed via the evaporation processing device 13 is transferred to the layer forming device 15 via the transfer chamber 14. Then, the work function adjusting layer is formed on the substrate G in the layer forming device 15.

Next, the substrate G is carried into the etching device 17 via the transfer chamber 16, and shapes of the formed layers are adjusted. After that, the substrate G is carried into the sputtering device 19 via the transfer chamber 18, and the cathode 2 is formed on the substrate G. Next, the substrate G is carried into the CVD device 21 via the transfer chamber 20, and the organic EL device is sealed. The organic EL device fabricated through the above processes is unloaded from the layer forming system 10 via the transfer chamber 22 and the unloader 23.

In the above layer forming system 10, when the stage 42 moves in the depressurized processing chamber 30 of the evaporation processing device 13, a state where the guide member 41 and the movable member 43 do not contact each other is maintained, and thus, there is no friction between the guide member 41 and the movable member 43. Therefore, the stage 42 may be moved smoothly without using grease. In this case, the refrigerant flows along the refrigerant path 44 to prevent the temperature of the magnets 47 and 48 from rising, and thus, the contact between the magnets 47 and 48 is prevented. In particular, since the shaft motor 50 performs as a driving member for moving the stage 42, the surface of the shaft 51 and the inner surface of the coil case 52 do not contact each other, and the processing chamber 30 is maintained clean.

In addition, the space 55 in the stage 42 is in communication with outer atmosphere of the processing chamber 30 via the duct member 80, and the power supplying line 60 supplying the electric power to the electromagnetic coil 53, the power supplying line 66 supplying the electric power to the electrostatic chuck 65, the pipe 71 supplying the heat transfer medium to the heat transfer medium paths 70, and the gas supplying pipe 73 supplying the heat transfer gas to the heat transfer gas supplying unit 72 are extended to outside of the processing chamber 30 through the inner portion of the duct member 80. Therefore, the holding of substrate G, the movement of stage 42, and the temperature adjustment of substrate G may be appropriately performed remotely from the outside of the processing chamber 30. Since the space 55 in the stage 42 and the inner portion of the coil case 52 are in communication with the outer atmosphere of the processing chamber 30, the space 55 in the stage 42 and the inner portion of the coil case 52 are maintained at atmospheric pressure. Therefore, in the processing chamber 30, vacuum insulation states of the stage 42 and the coil case 52 may be avoided. In addition, the heat generated due to, for example, the electric current supplied to the electromagnetic coil 53 may be easily discharged out of the processing chamber 30, and thus, the electromagnetic coil 53 may be cooled down.

While this invention has been particularly shown and described with reference to exemplary embodiments thereof, the present invention is not limited to the above example. It will be understood by those skilled in the art that various changes in form and details may be made therein without departing from the spirit and scope of the invention as defined by the appended claims. For example, the deposition processing device 13 for forming the light emitting layer 3 in the organic EL device is described above, however, the present invention may be applied to vacuum processing devices for processing various electronic devices.

In addition, the processing chamber 30 may include only one area, however, the processing chamber 30 may be divided into an insertion area, a processing area, and a discharge area. This situation refers to cases the size of the processing chamber 30 is large, and is advantageous for processing and manufacturing processing chambers and for conveying and assembling the processing chambers in factories when the processing devices are assembled in a certain service area. In addition, the processing device may be changed only by replacing the processing area.

The substrate G in the present invention may be the glass substrate, a silicon substrate, an angular substrate, and a circular substrate.

In addition, when the duct member 80 has a robot arm function for driving the stage so as to serve as both of the duct member 80 and the transfer mechanism, the shaft motor 50 is not necessary. In addition, when there is no need to extend lines or pipes in the stage 42, the duct member 80 is not necessary. The electric lines may be omitted due to non-contact electricity application. In addition, the stage 42 may include a heater.

Also, when the stage 42 is installed in a vacuum space, the temperature of the stage 42 may rise. To deal with the above problem, a cooling mechanism such as a chiller for cooling the stage may be installed. Otherwise, a motor having an appropriate power may be selected to restrict the heat generation.

The duct member 80 may be installed on both sides of the stage 42 or one side of the stage 42, or may be installed asymmetrically on the stage 42. There is no limitation in the number of the duct member 80.

Figure 9:
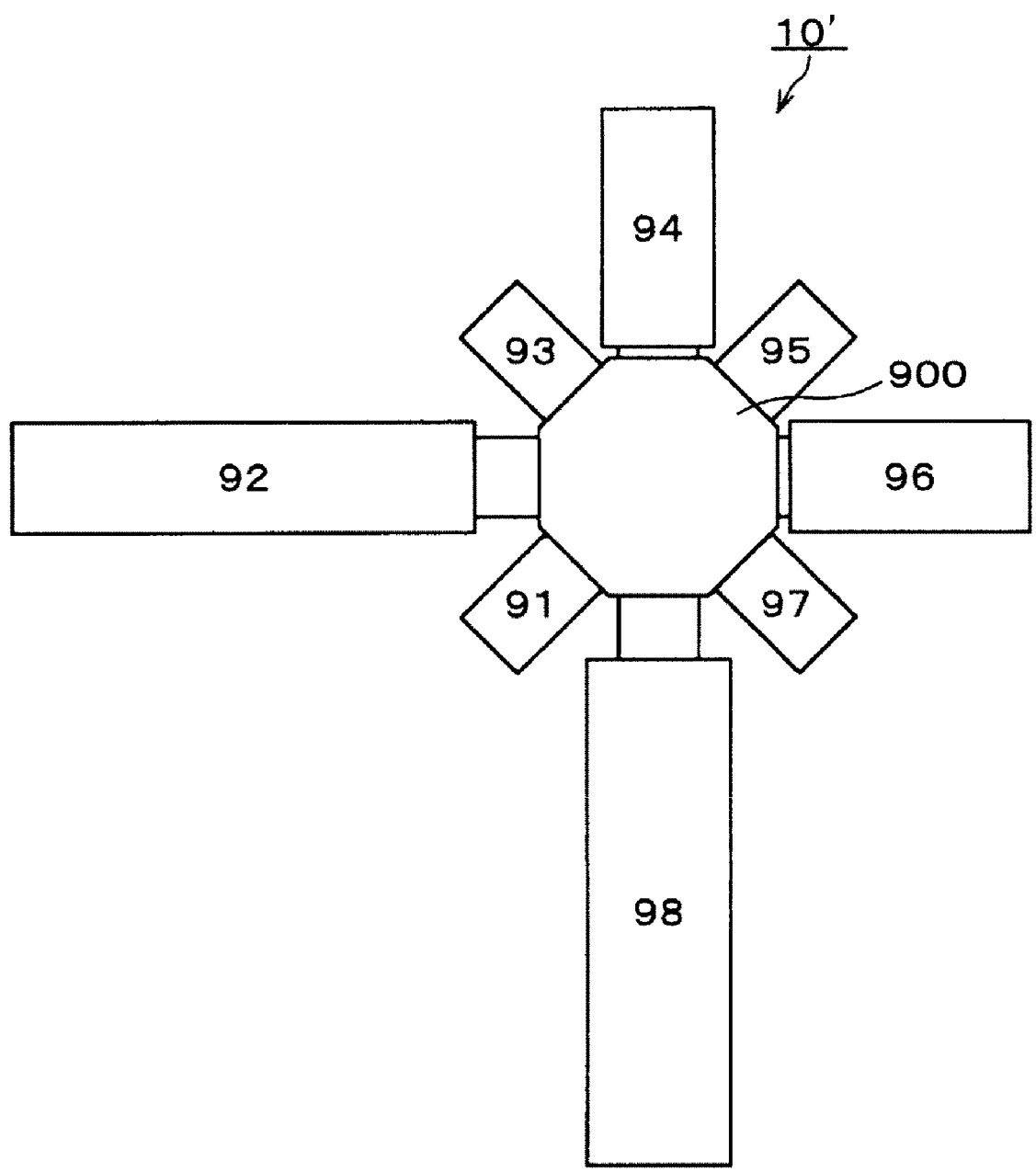
FIG. 9 is a view illustrating a layer forming system, in which processing apparatuses are disposed around a transfer chamber.

In FIG. 2, the layer forming system 10 includes the loader 11, the transfer chamber 12, the evaporation processing device 13 of the light emitting layer 3, the transfer chamber 14, the layer forming device 15 of the work function adjusting layer, the transfer chamber 16, the etching device 17, the transfer chamber 18, the sputtering device 19, the transfer chamber 20, the CVD device 21, the transfer chamber 22, and the unloader 34 which are arranged in series along the transfer direction of the substrate G. However, as shown in FIG. 9, a layer forming system 10' may have a structure in which a substrate load-lock device 91, a layer forming device 92 by the sputtering deposition, an alignment device 93, an etching device 94, a mask load-lock device 95, a CVD device 96, a substrate reverse device 97, and a layer deposition device 98 may be arranged around a transfer chamber 900. The number of each processing device and arrangement of the processing devices may vary.

Figure 10:
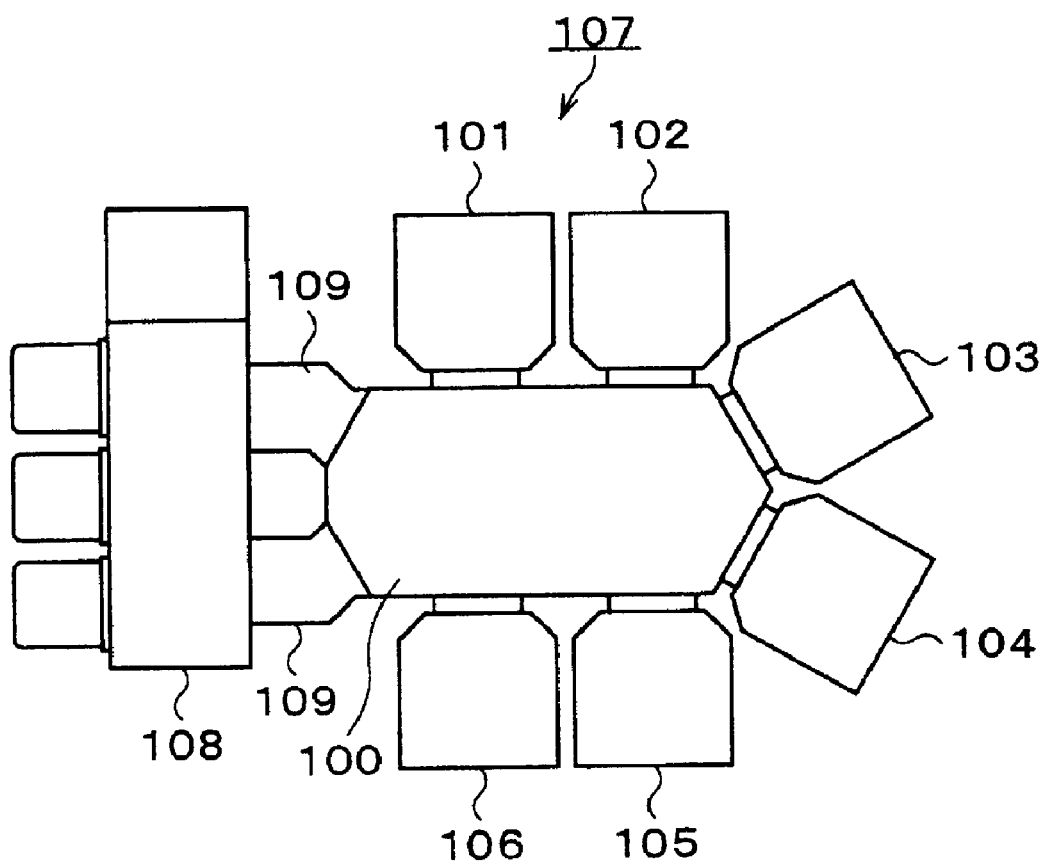
FIG. 10 is a view illustrating a processing system, in which six processing apparatuses are placed around the transfer chamber.

For example, as shown in FIG. 10, the present invention may be applied to a processing system 107 in which six processing devices 101~106 are placed around a transfer chamber 100. In the processing system 107 illustrated in FIG. 10, the substrate G may be carried into/out the transfer chamber 100 through two load-lock chambers 109 from an inlet/outlet 108, and then, the substrate G may be carried into/out each of the processing devices 101~106 by the transfer chamber 100. As described above, the number and arrangement of the processing devices installed in the processing system are optional.

In addition, in the deposition processing device 13, the substrate G inserted into the processing chamber 30 through the inlet 32 is carried out/unloaded through the outlet 31 after being processed. However, an inlet/outlet may be formed, and the substrate G inserted through the inlet/outlet may be carried out/unloaded through the inlet/outlet after being processed. In addition, the transfer path of the substrate G may be formed so that the substrate G may be carried out/unloaded from the processing chamber 30 as soon as possible after being processed.

In addition, the materials ejected from each of the heads of the deposition head 90 may be the same, or may be different from each other. Also, the successive number of heads is not limited to six. In addition, various processing sources may be installed instead of the deposition head 90. For example, the present invention may be applied to various processing devices for forming layers (plasma vapor deposition (PVD) and CVD), etching, thermal processing, and irradiating lights.

The present invention may be applied to manufacturing of the organic EL devices.

According to the present invention, there is no friction between the guide member and the movable member, and the stage may be moved smoothly without using grease. In particular, since the shaft motor is used as the driving member to move the stage, the clean state of the processing chamber may be maintained in a depressurized condition. In addition, since there is no physical contact between the components, it is not necessary to replace the components due to ablasion or grease contamination, and thus, time required to manufacture the processing device and fabrication costs may be reduced. Also, since the grease is not necessary, a dry cleaning operation of the inner portion of the processing chamber may be performed easily.

In addition, the space formed in the stage is in communication with the outer atmosphere of the processing chamber via the duct member, and thus, lines for supplying electric power to the electrostatic chuck and the shaft motor, the heat transfer medium pipe, and the heat transfer gas supplying pipe may be disposed in the duct member. Therefore, holding a substrate using a chuck, moving a stage, and adjusting the temperature of the substrate may be performed remotely from the outside of the processing chamber.

The invention claimed is:

1. A processing apparatus for processing a substrate, the processing apparatus comprising:
   a processing chamber for processing the substrate;
   a depressurizing mechanism reducing an internal pressure of the processing chamber; and
   a transfer mechanism disposed in the processing device chamber to convey the substrate,
   wherein the transfer mechanism comprises:
   a guide member;
   a stage for holding the substrate, the stage including a space isolated from an inner atmosphere of the processing chamber;
   a driving member for moving the stage; and
   a movable member supporting the stage and moving along the guide member,
   wherein the guide member and the movable member are maintained so as not to contact each other by a repulsive force of magnets,
   wherein a duct member is used for communication of the space with the outer atmosphere of the processing chamber and for restriction of at least one of an axial movement and a rotation of the stage, and
   wherein the driving member is cooled down by the outer atmoshere introduced through the duct member.

2. The processing apparatus of claim 1, further comprising a cooling mechanism for cooling the magnets.

3. The processing apparatus of claim 1, wherein the stage includes an electrostatic chuck holding the substrate, and a line for supplying an electric power to the electrostatic chuck is disposed in the duct member.

4. The processing apparatus of claim 1, wherein the driving member is a motor, and a line for supplying an electric power to the motor is disposed in the duct member.

5. The processing apparatus of claim 4, wherein the motor is a shaft motor.

6. The processing apparatus of claim 1, wherein the stage includes heat transfer medium paths for adjusting a temperature of the substrate, and a pipe for supplying a heat transfer medium to the heat transfer medium paths is disposed in the duct member.

7. The processing apparatus of claim 6, wherein the stage includes a heat transfer gas supplying unit which supplies a heat transfer gas between the substrate and the stage, and a pipe for supplying the heat transfer gas to the heat transfer gas supplying unit is disposed in the duct member.

8. The processing apparatus of claim 1, wherein the space is maintained at an atmospheric pressure.

9. The processing apparatus of claim 1, wherein the duct member is formed of a multi-joint arm.

10. The processing apparatus according to claim 1, further comprising a deposition head supplying a vaporized layer forming material onto the substrate held by the stage.

11. The processing apparatus of claim 10, wherein the layer forming material is a material used to form a light emitting layer in an organic electroluminescence (EL) device.

* * * * *